(12) United States Patent
Kim et al.

(10) Patent No.: US 7,830,239 B2
(45) Date of Patent: Nov. 9, 2010

(54) DEVICE TO PROTECT AGAINST A SURGE VOLTAGE AND AN ELECTRONIC APPARATUS INCLUDING THE SAME

(75) Inventors: Hee-man Kim, Suwon-si (KR); Atsuhisa Ogawa, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1086 days.

(21) Appl. No.: 11/426,451

(22) Filed: Jun. 26, 2006

(65) Prior Publication Data

US 2006/0291127 A1    Dec. 28, 2006

(30) Foreign Application Priority Data

Jun. 27, 2005    (KR)    ............... 10-2005-0055947

(51) Int. Cl.
*H01C 7/10*    (2006.01)
(52) U.S. Cl. .................. 338/21; 338/307; 338/327
(58) Field of Classification Search ............ 338/20–21, 338/307–309, 327–328, 332
See application file for complete search history.

(56) References Cited

U.S. PATENT DOCUMENTS

| | | | |
|---|---|---|---|
| 5,155,464 A | * | 10/1992 | Cowman et al. ............. 338/21 |
| 5,438,473 A | * | 8/1995 | Allina ........................ 361/118 |
| 5,969,929 A | | 10/1999 | Kleveland et al. |
| 5,985,414 A | * | 11/1999 | Fukuda et al. ............... 428/192 |
| 6,549,114 B2 | * | 4/2003 | Whitney et al. ............... 338/21 |
| 6,657,532 B1 | * | 12/2003 | Shrier et al. .................. 338/21 |

FOREIGN PATENT DOCUMENTS

| | | |
|---|---|---|
| CN | 1542873 | 11/2004 |
| JP | 2001-60838 | 3/2001 |
| KR | 1999-16743 | 3/1999 |
| KR | 2004-80823 | 9/2004 |
| KR | 2004-89550 | 10/2004 |

OTHER PUBLICATIONS

Chinese Office Action dated Sep. 19, 2008 issued in CN 2006-10128570.4.

* cited by examiner

*Primary Examiner*—Kyung Lee
(74) *Attorney, Agent, or Firm*—Stanzione & Kim, LLP

(57) ABSTRACT

A device to protect against a surge voltage includes a body having a hexahedron shape and filled with a varistor material, a pair of input signal electrodes attached to a first side surface of the body along upward and downward directions, a pair of output signal electrodes attached to a second side surface of the body that faces the first side surface of the body in the upward and downward directions, a ground electrode attached to an upper surface of the body, at least one pair of signal connection electrode plates to connect the input signal electrodes and the output signal electrodes, and a ground plate to be connected to the ground electrode. Thus, the device can protect an electronic circuit from a surge voltage and match an impedance of a transmission line.

43 Claims, 16 Drawing Sheets

DEVICE TO PROTECT AGAINST A SURGE VOLTAGE AND AN ELECTRONIC APPARATUS INCLUDING THE SAME

CROSS-REFERENCE TO RELATED APPLICATIONS

This application claims the benefit of Korean Patent Application No. 2005-55947, filed on Jun. 27, 2005, in the Korean Intellectual Property Office, the disclosure of which is incorporated herein by reference in its entirety.

BACKGROUND OF THE INVENTION

1. Field of the Invention

The present general inventive concept relates to a device to protect an electronic circuit from a surge voltage and to match an impedance, and more particularly to, an electronic apparatus having a device to protect an electronic circuit from a surge voltage.

2. Description of the Related Art

Generally, a surge voltage is generated by static electricity of a human body as well as by lightning, strong electromagnetism, arc, induction load switching, etc.

Electronic apparatuses such as mobile phones and computers have become smaller and more efficient while an internal voltage of electronic components disposed therein has been lowered.

An internal electric circuit of these electronic apparatuses may be damaged by a static pulse which is generated by contact between the human body and the electronic apparatuses, since a high voltage ranging from hundreds to thousands of volts may be generated by static electricity for a short period of time and may be supplied to the electronic apparatuses.

A varistor is a surge protection device that is disposed between an input line and an output line of the electronic apparatuses and can change resistance according to a supply voltage.

Since the varistor changes its resistance according to the supply voltage, it is widely used to protect main electronic components and circuits from the static electricity generated by the human body. If the varistor receives a surge voltage due to an overvoltage or lightning, the resistance of the varistor drastically decreases creating an instant shunt path for the overvoltage in order to protect the main electronic components and circuits connected in parallel with the varistor from the static electricity and the overvoltage.

That is, the varistor functions as a capacitor if an input voltage is smaller than a predetermined voltage. If the input voltage is larger than the predetermined voltage, the varistor functions as a resistor having a small resistance value.

When the varistor is supplied to a transmission line and comprises a capacitance between terminals (i.e., the input line and the output line), line impedance of the transmission line partially decreases due to the capacitance. As a result, uniformity of the line impedance decreases, thereby deteriorating a signal waveform.

Conventionally, a varistor having a small capacitance is used to minimize the foregoing problem. However, the line impedance is partially decreased even by the small capacitance. Particularly, the signal waveform deteriorates due to the varistor when transmitting a broadband high speed signal.

FIG. 1 illustrates an impedance change when a conventional varistor 2 is used.

As illustrated in FIG. 1, the impedance is changed where a measuring instrument and a transmission line 1 are connected to each other, and is partially lowered where the conventional varistor 2 is connected to the transmission line 1. That is, where the transmission line 1 having an impedance of 100Ω and the conventional varistor 2 having a load of 100Ω are connected to each other, the impedance is lowered to 83 Ω.

The lowered impedance deteriorates signal transmissions and does not satisfy the most recently set signal transmission standards such as the high definition multi-media interface (HDMI).

SUMMARY OF THE INVENTION

The present general inventive concept provides a device to protect an electronic circuit from a surge voltage and to match impedance of a transmission line.

Additional aspects of the present general inventive concept will be set forth in part in the description which follows and, in part, will be obvious from the description, or may be learned by practice of the present general inventive concept.

The foregoing and/or other aspects of the present general inventive concept may be achieved by providing a device to protect against a surge voltage, comprising a body having a hexahedron shape and filled with a varistor material, a pair of input signal electrodes attached to a first side surface of the body in upward and downward directions, a pair of output signal electrodes attached to a second side surface of the body that faces the first side surface of the body in the upward and downward directions, a ground electrode attached to an upper surface of the body, at least one pair of signal connection electrode plates to connect the input signal electrodes and the output signal electrodes, and a ground plate to be connected to the ground electrode.

The ground plate may comprise a first ground plate provided in the body to cross a plate surface of the ground electrode in contact therewith, and at least one second ground plate provided in the body to cross a plate surface of the first ground plate in contact therewith.

The input signal electrodes and the output signal electrodes may extend from the first and second side surfaces along the upper surface and/or a lower surface of the body along a predetermined distance, respectively.

The at least one second ground plate may include a pair of second ground plates spaced apart from each other in the body, and the at least one pair of signal connection electrode plates may be disposed on opposite sides of the first ground plate and between the pair of second ground plates on opposite sides within the body.

The pair of second ground plates and the at least one pair of signal connection electrode plates may be symmetrical with respect to the first ground plate.

The at least one pair of signal connection electrode plates may be spaced apart from the respective second ground plates at a same interval.

The ground plate may include a plurality of ground plates respectively disposed on outer side surfaces extending between the first side surface and the second side surface of the body and perpendicular to the first and second side surfaces.

The input signal electrodes and the output signal electrodes may extend from the first and second side surfaces along the upper surface and/or a lower surface of the body along a predetermined distance.

The foregoing and/or other aspects of the present general inventive concept may also be achieved by providing a device to protect against a surge voltage, comprising a body having a varistor material, an internal conductor having a bar shape and extending through the body, an external conductor having a cylindrical shape and spacedly provided along an outside of the internal conductor and surrounding the body, at least one signal electrode protruding from the internal conductor toward the external conductor without contacting the external conductor, at least one ground electrode protruding from the external conductor toward the internal conductor without contacting the internal conductor, and a varistor material disposed between the external conductor and the internal conductor.

The at least one signal electrode may include a plurality of signal electrodes having plate shapes that extend along a lengthwise direction of the internal conductor, and being spaced around a circumferential direction of the internal conductor by a predetermined radial angle about an axis of the internal conductor.

The at least one ground electrode may include a plurality of ground electrodes having plate shapes that extend along a lengthwise direction of the external conductor and being spaced around a circumferential direction of the external conductor by a predetermined radial angle.

The plurality of ground electrodes may be disposed between the signal electrodes.

The at least one signal electrode may include a plurality of signal electrodes having round plate shapes that extend in a radial direction of the internal conductor.

The at least one ground electrode may include a plurality of ground electrodes having round plate shapes which comprise a through hole through which the internal conductor passes.

The plurality of ground electrodes may be disposed between the signal electrodes.

Opposite end terminals of the internal conductor may comprise an input terminal and an output terminal that are connectable with an unbalanced transmission line.

The foregoing and/or other aspects of the present general inventive concept may also be achieved by providing a surge protection device, comprising a body including a varistor material, at least one input terminal disposed at a first side of the body, at least one output terminal disposed at a second side of the body, at least one signal electrode to connect the at least one input terminal with the at least one output terminal and passing through the body, and at least one ground electrode disposed outside the body and extending into the body about the at least one signal electrode.

The foregoing and/or other aspects of the present general inventive concept may also be achieved by providing a varistor, comprising an outer conductor, an inner conductor disposed within the outer conductor to propagate a signal, a plurality of outer conductor plates extending from an inner surface of the outer conductor, and a plurality of inner conductor plates extending from an outer surface of the inner conductor in between the plurality of outer conductor plates.

The foregoing and/or other aspects of the present general inventive concept may also be achieved by providing an electronic apparatus, comprising a printed circuit board having a board input terminal and a board output terminal thereon, and a surge protection device. The surge protection device has a body including a varistor material, at least one input terminal disposed at a first side of the body in contact with the board input terminal, at least one output terminal disposed at a second side of the body in contact with the board output terminal, at least one signal electrode to connect the at least one input terminal with the at least one output terminal and passing through the body, and at least one ground electrode disposed outside the body and extending into the body about the at least one signal electrode.

BRIEF DESCRIPTION OF THE DRAWINGS

These and/or other aspects of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
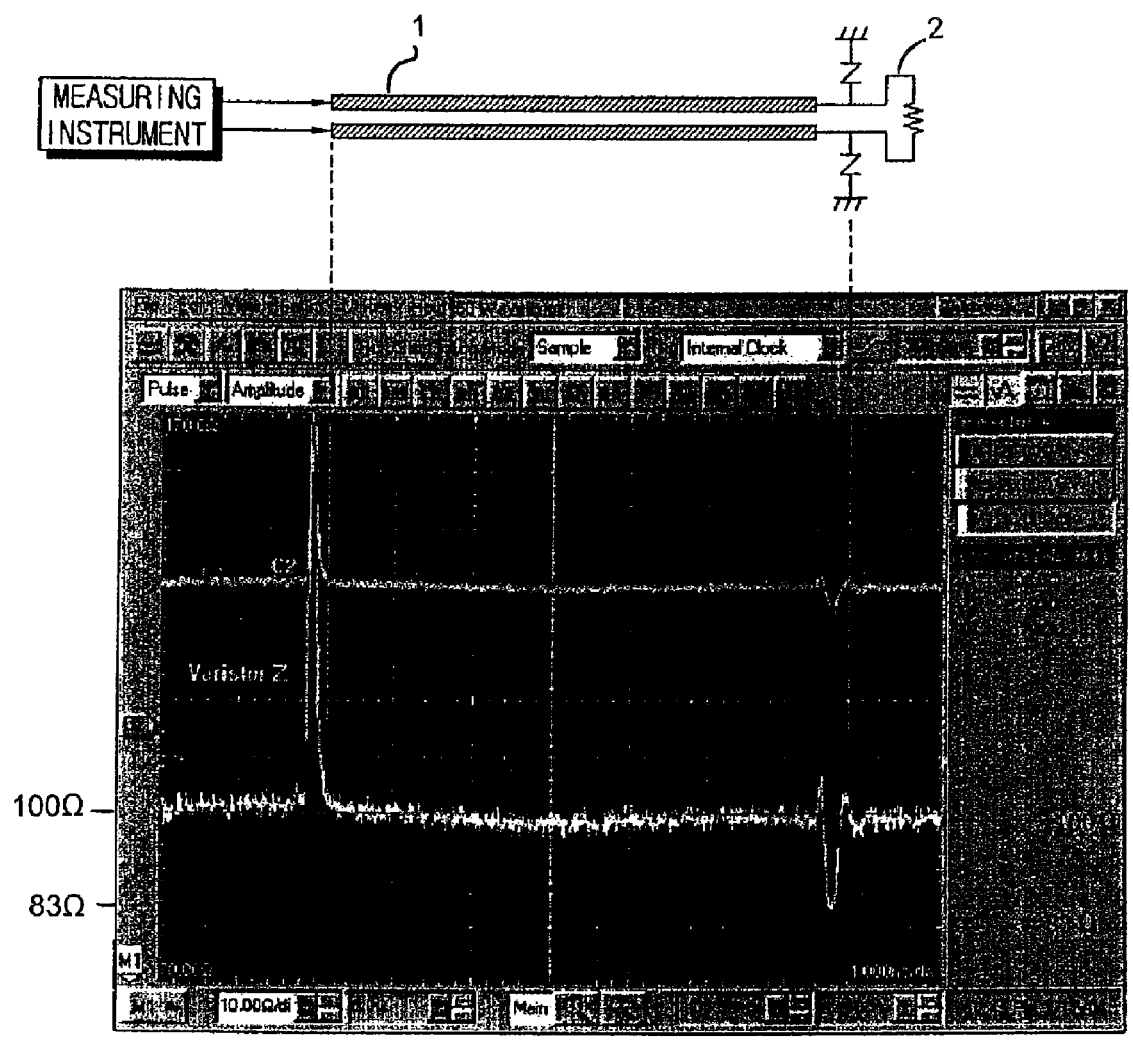
FIG. 1 illustrates impedance characteristics of a conventional varistor.

Reference will now be made in detail to the embodiments of the present invention, examples of which are illustrated in the accompanying drawings, wherein like reference numerals refer to like elements throughout. The embodiments are described below in order to explain the present general inventive concept by referring to the figures.

Figure 2:
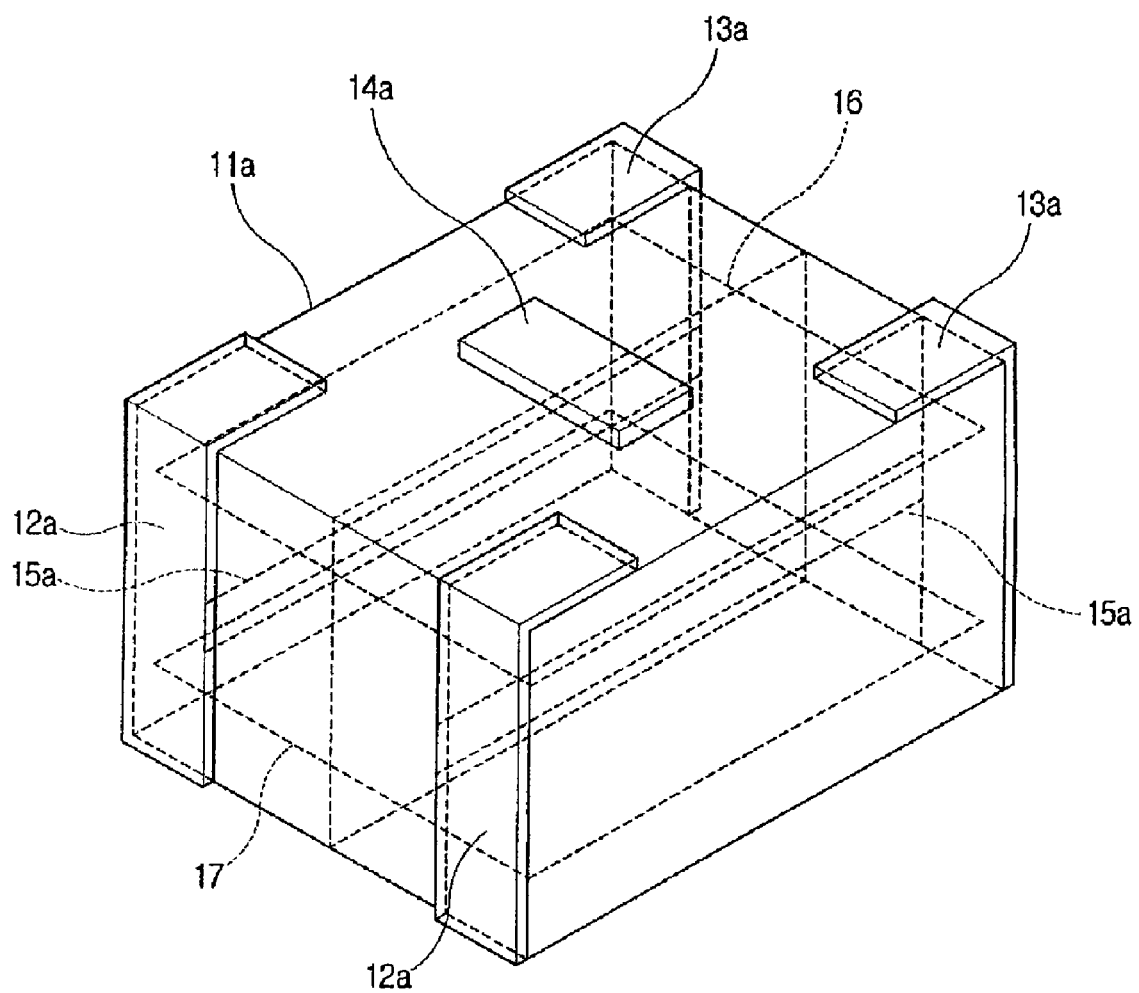
FIG. 2 is a perspective view illustrating a device to protect against a surge voltage according to an embodiment of the present general inventive concept.
Figure 3A:
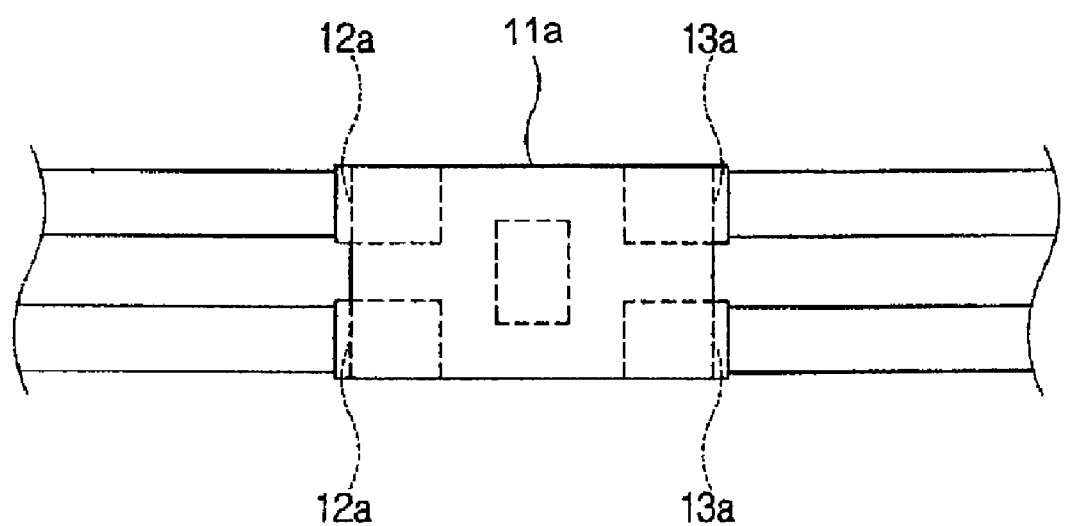
FIG. 3A is a front view illustrating an electronic apparatus having the device to protect against the surge voltage of FIG. 2 when the device is disposed on a printed circuit board (PCB)
Figure 3B:
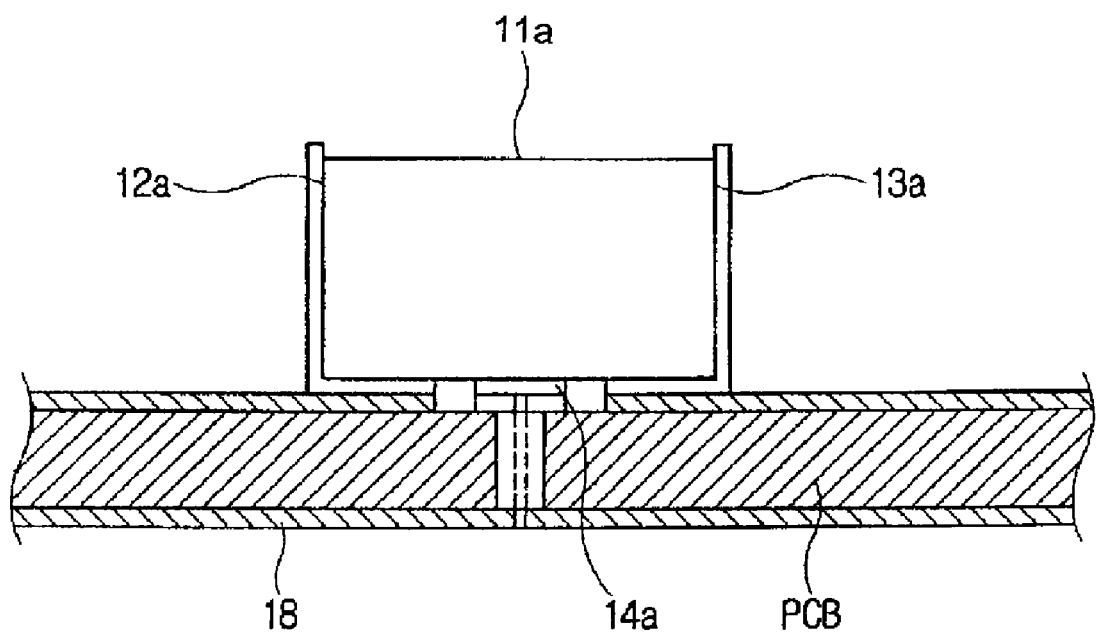
FIG. 3B is a sectional view illustrating an electronic apparatus having the device to protect against the surge voltage in FIG. 2 when the device is disposed on the PCB.

FIG. 2 is a perspective view illustrating a device to protect against a surge voltage according to an embodiment of the present general inventive concept, FIG. 3A is a front view illustrating an electronic apparatus having the device to protect against the surge voltage of FIG. 2 when the device is disposed on a printed circuit board (PCB), and FIG. 3B is a sectional view illustrating the electronic apparatus having the device to protect against the surge voltage in FIG. 2 when the device is disposed on the PCB. As illustrated in FIG. 2, the device to protect against a surge voltage comprises a body 11*a* which includes a varistor material, input signal electrodes 12*a* and output signal electrodes 13a to input and output a signal, respectively, a ground electrode 14a to be connected to a ground, signal connection electrode plates 15a to connect the input signal electrode 12a and the output signal electrode 13a, and a ground plate including first and second ground plates 16 and 17.

The body 11a may be shaped like a hexahedron (e.g., a cube, a rectangular cube, etc.). The cube may comprise smooth edges, instead of right angles.

The varistor material changes its resistance characteristics according to a supply voltage. The varistor material may be a variety of materials such as metal oxide, silicon, and gas. Hereinafter, the varistor material is assumed to be metal oxide. However, it should be understood that the scope of the present general inventive concept is not intended to be limited thereto and that other materials may also be used.

The metal oxide may comprise zinc oxide (ZnO). Additionally, other materials such as $SB_2O_3$, $Co_3O_4$, $MnCO_3$, $NiO$, $Cr_2O_3$ may be added thereto.

An outer surface of the body 11a may be insulated by an insulating material. The insulating material may comprise epoxy powder, liquid paint, or ceramic. Other materials may also be used as the insulating material.

The input signal electrodes 12a allow a transmission signal propagating along a transmission line to be input to the body 11a. The input signal electrodes 12a may include a pair of electrodes, and may be attached to a first side of the body 11a along upward and downward directions. The pair of input signal electrodes 12a may be connected to each line of a pair of parallel transmission lines. The input signal electrodes 12a may extend around upper and/or lower edges to the body 11a to extend along an upper surface and/or a lower surface of the body 11a along a predetermined distance thereof. As illustrated in FIGS. 3A and 3B, if the device to protect against the surge voltage according to the present embodiment is disposed on a printed circuit board (PCB), the input signal electrodes 12a that extend over the upper surface and/or the lower surface of the body 11a by the predetermined distance may be more easily attached to the PCB. Additionally, an interval corresponding to the ground plate (described below) can be adjusted more easily, thereby adjusting an impedance of the device to protect against the surge voltage. The input signal electrodes 12a may be conductors to allow electricity to flow smoothly. When the input signal electrodes 12a are disposed on the PCB, the input signal electrodes 12a may be coated with nickel, and may then be coated with lead, tin, or a combination of thereof to enhance reliability of soldering when being disposed on the PCB.

The output signal electrodes 13a may be attached to a second side opposite to the first side of the body 11a in the upward and downward directions.

The output signal electrodes 13a output the transmission signal input to the body 11a via the input signal electrodes 12a. The output signal electrodes 13a may include a pair of electrodes to be attached to the second side of the body 11a opposite to the first side of the body 11a in the upward and downward directions. The output signal electrodes 13a may also extend around the upper and/or lower edges of the body 11a and over the upper surface and/or the lower surface of the body 11a along the predetermined distance. In particular, the output signal electrodes 13b that extend over the upper surface and/or the lower surface of the body 11a by the predetermined distance may be more easily attached to the PCB. The output signal electrodes 13a are also conductors to allow electricity to flow smoothly. The input signal electrodes 12a and the output signal electrodes 13a may be connected to a common input transmission line and a common output transmission line, respectively.

As illustrated in FIG. 2, the input signal electrodes 12a and the output signal electrodes 13a may be connected to the respective edges of the first and second sides of the body 11a, or may not be connected to the edges thereof.

The ground electrode 14a is attached to the upper surface of the body 11a. Alternatively, the ground electrode 14a may be attached to the lower surface of the body 11a.

As illustrated in FIG. 3B, the ground electrode 14a may be attached to an external ground plate 18 which is disposed on an outside of the device to protect against the surge voltage according to the present embodiment. The ground electrode 14a may protrude from a center of the upper surface of the body 11a in an upward direction. The ground electrode 14a is also a conductor.

The signal connection electrode plates 15a connect the input signal electrodes 12a and the output signal electrodes 13a to output the transmission signal input to the input signal electrodes 12a and to the output signal electrodes 13a. The signal connection electrode plates 15a may include a pair of plates. The signal connection electrode plates 15a may be connected to an internal surface of the input signal electrodes 12a and the output signal electrodes 13a to make a capacitance value which is generated between the input and output signal electrodes 12a and 13a (described below) uniform across the signal connection electrode plates 15a. If the signal connection electrode plates 15a are connected to a center of the input signal electrodes 12a and the output signal electrodes 13a, a capacitance with the ground plate may be changed around an end terminal of the signal connection electrode plates 15a. The signal connection electrode plates 15a are conductors and may be spaced from the ground plate (i.e., including the first and second ground plates 16 and 17) at a same interval.

The ground plate comprises the first ground plate 16 which is provided in the body 11a, and is perpendicular to a plate surface of the ground electrode 14a and is in contact therewith, and the second ground plate 17 which is provided in the body 11a, and is perpendicular to a plate surface of the first ground plate 16 and is in contact therewith. That is, the ground electrode 14a and the first ground plate 16 meet at right angles, and the first ground plate 16 and the second ground plate 17 meet at right angles.

The second ground plate 17, the input signal electrodes 12a, the output signal electrodes 13a, and the second ground plate 15 are symmetrical with respect to the first ground plate 16. Here, the first ground plate 16 may be connected with the first and second surfaces of the body 11a in between the input and output signal electrodes 12a and 13a.

The second ground plate 17 may include a pair of plates to be spaced apart from each other in the body 11a. The second ground plates 17 may be spaced at a same interval in the upward and downward directions based on the signal connection electrode plates 15a. The second ground plates 17 connectably cross with the first ground plate 16, but may not be connected to the input signal electrodes 12a and the output signal electrodes 13a. The first ground plate 16 and the second ground plates 17 are also conductors.

With the foregoing configuration, the device to protect against the surge voltage according to the present embodiment functions as a varistor to prevent damages caused by the surge voltage and adjusts the impedance of the device to transmit a transmission signal therethrough without attenuation.

Particularly, the varistor may be adjusted by varying types of metal oxide included in the body 11a and by varying intervals between the signal connection electrode plates 15a and the first and second ground plates 16 and 17. A characteristic impedance of the body 11a may be determined by size and interval that corresponds to the first ground plate 16 of the signal connection electrode plates 15a, and by electric permittivity of the metal oxide which functions as the varistor. Thus, even when the device to protect against the surge voltage is inserted to the transmission line, the impedance may be matched.

Figure 4A:
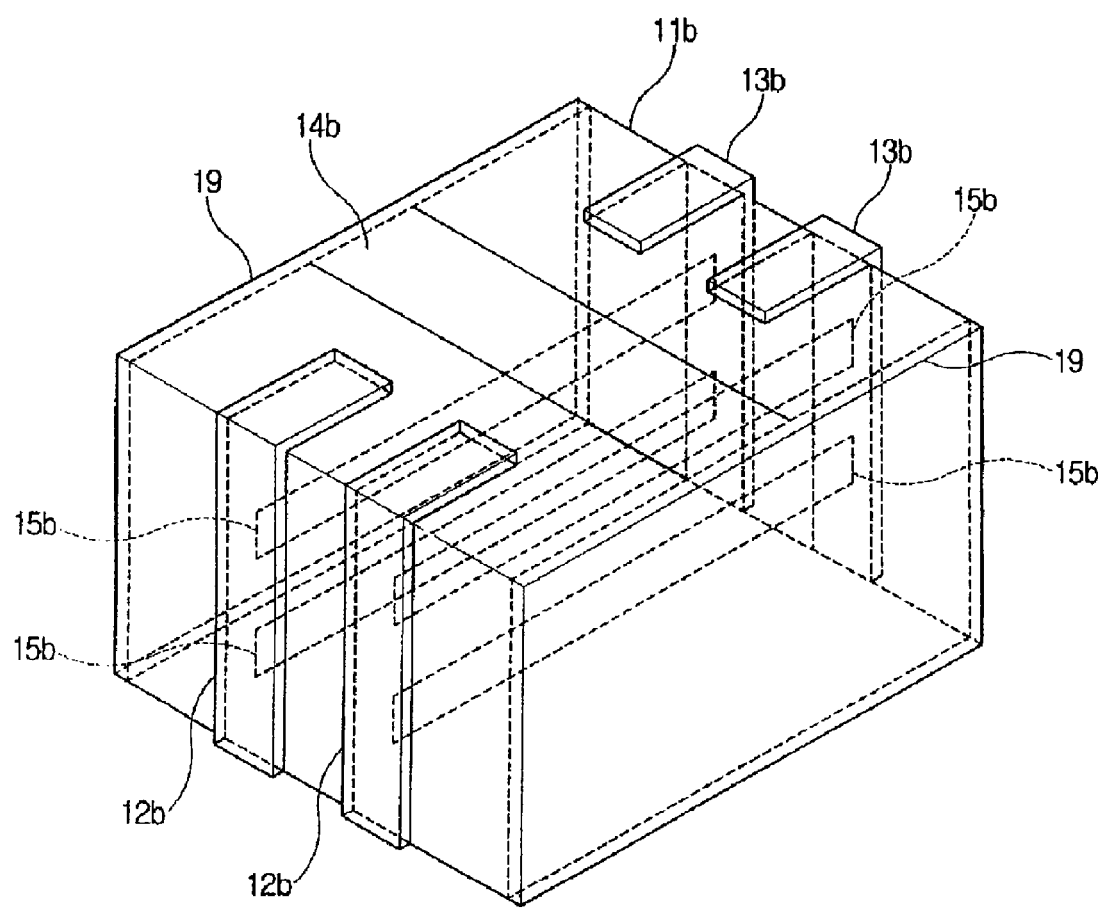
FIG. 4A is a perspective view illustrating a device to protect against a surge voltage according to another embodiment of the present general inventive concept.
Figure 4B:
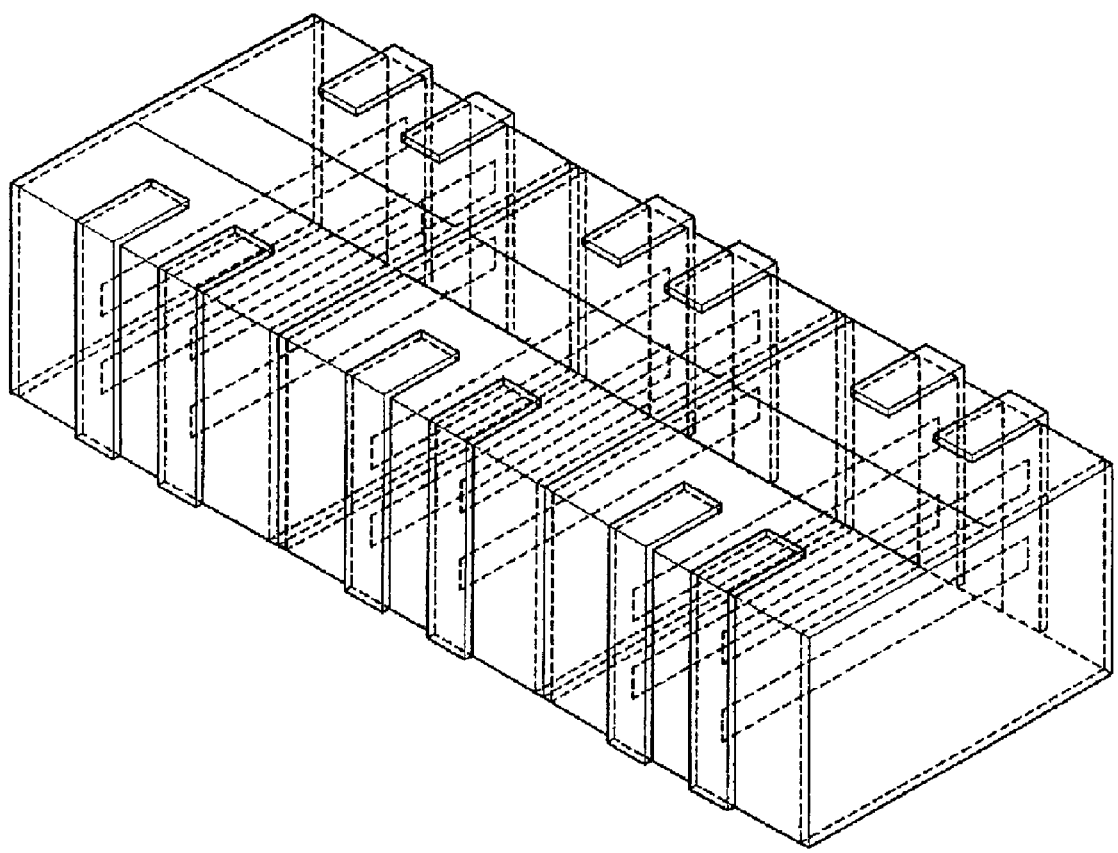
FIG. 4B is a perspective view illustrating the device to protect against the surge voltage in FIG. 4A when the device is in an array form.

FIG. 4A is a perspective view illustrating a device to protect against a surge voltage according to another embodiment of the present general inventive concept, and FIG. 4B is a perspective view illustrating the device to protect against the surge voltage of FIG. 4A when the device is in an array form. As illustrated in FIG. 4A, the device to protect against the surge voltage comprises a body 11b of metal oxide, input signal electrodes 12b and output signal electrodes 13b disposed along first and second sides of the body 11b, respectively, to input and output a signal, a ground electrode 14b to be connected to a ground, signal connection electrode plates 15b to connect the input signal electrodes 12b and the output signal electrodes 13b, and a pair of ground plates 19 which are respectively attached to an outer surface of the body 11b that are perpendicular to the first side and the second side of the body 11b and extend between the first and second sides of the body 11b.

The body 11b, the input signal electrodes 12b, the output signal electrodes 13b, the ground electrode 14b, and the signal connection electrode plates 15b function similarly to respective parts illustrated in FIG. 2.

The ground plates 19 are connected with the ground electrode 14b attached to an upper part of the body 11b to protect electronic elements from an overvoltage supplied from the signal connection electrode plates 15b when the surge voltage is generated. The ground plates 19 are conductors.

The signal connection electrode plates 15b may include a pair (or more) of plates to change a breakdown voltage when they function as a varistor.

Characteristic impedance may be determined by a size and an interval of the signal connection electrode plates 15b that correspond to the ground plates 19, and by electric permittivity of the metal oxide.

As illustrated in FIG. 4B, the device to protect against the surge voltage according to the present embodiment may be provided in an array form. In this case, a plurality of bodies (corresponding to the body 11b in FIG. 4A) can be arranged adjacent to each other in an array such that ground plates (corresponding to the ground plates 19 in FIG. 4A) which are provided on outer surfaces of the bodies are connected to each other. Accordingly, the device to protect against the surge voltage in the array form can be a single device that is inserted to a plurality of transmission lines at the same time.

Hereinafter, a device to protect against the surge voltage used in a same axial line having internal and external conductors will be described. Hereinafter, the "axis" refers to an axis in a lengthwise direction of the same axial line shared by the internal and external conductors.

Figure 5A:
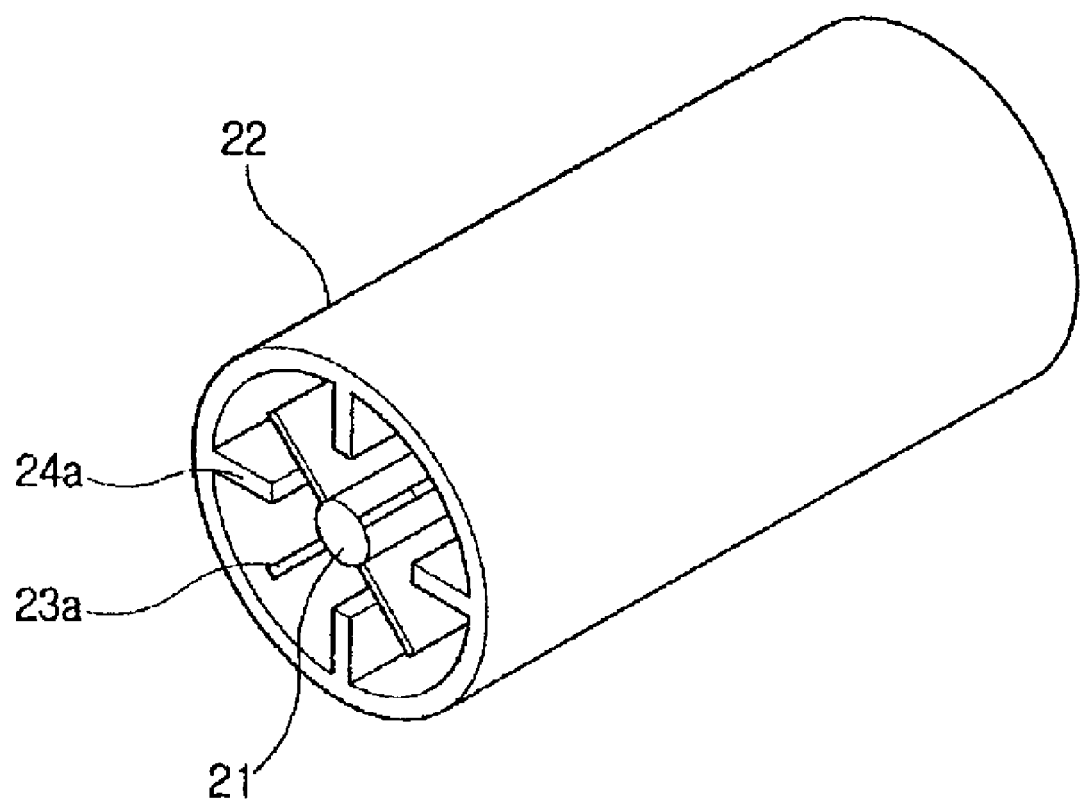
FIG. 5A is a perspective view illustrating a device to protect against a surge voltage according to another embodiment of the present general inventive concept.
Figure 5B:
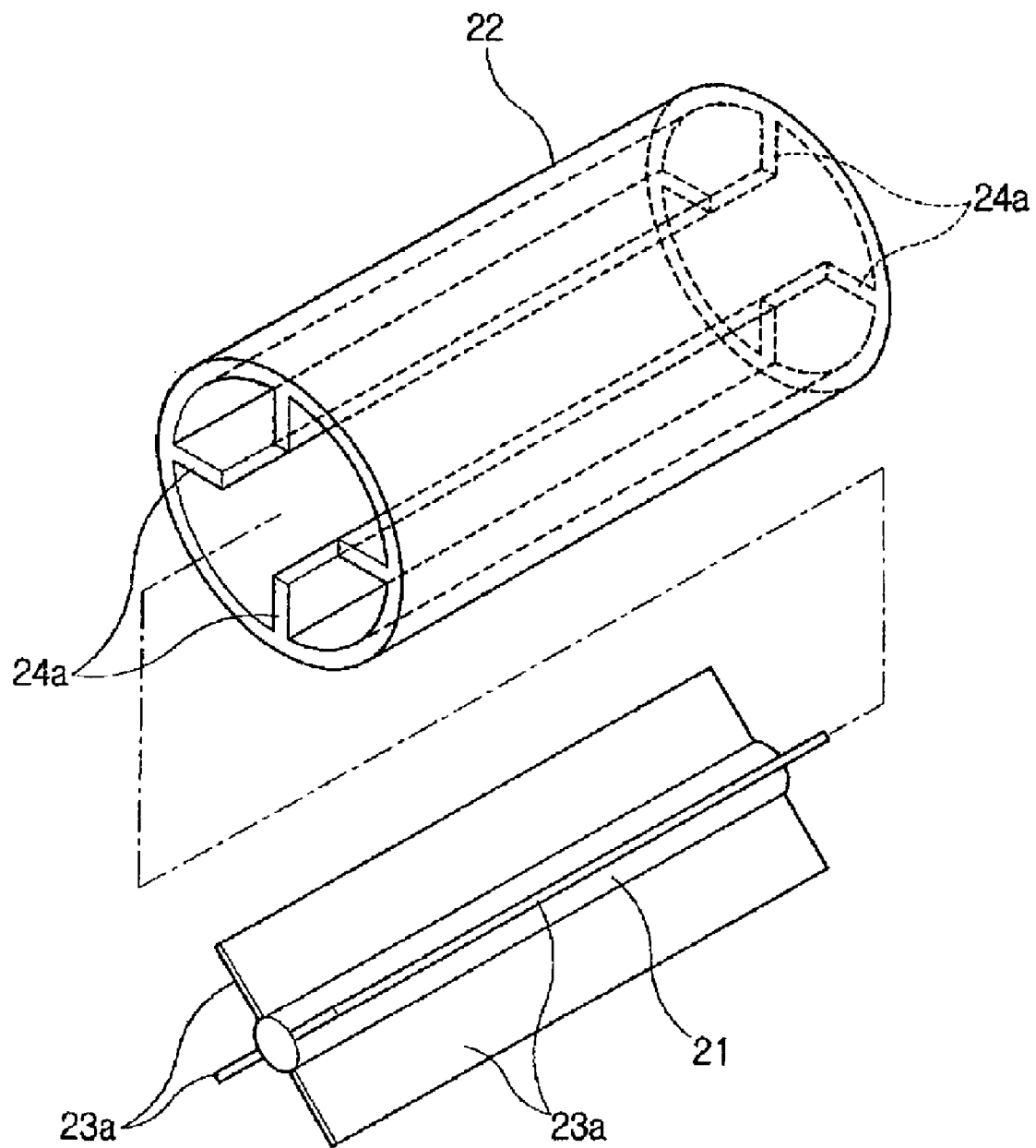
FIG. 5B is an exploded perspective view illustrating the device to protect against the surge voltage of FIG. 5A.

FIG. 5A is a perspective view illustrating a device to protect against a surge voltage according to another embodiment of the present general inventive concept, and FIG. 5B is an exploded perspective view illustrating the device to protect against the surge voltage of FIG. 5A. As illustrated in FIGS. 5A through 5B, a device to protect against the surge voltage includes an internal conductor 21 which is shaped like a bar, an external conductor 22 which surrounds the internal conductor 21, signal electrodes 23a connected to the internal conductor 21, and ground electrodes 24a connected to the external conductor 22. The device to protect against the surge voltage according to the present embodiment may comprise metal oxide disposed between the external conductor 22 and the internal conductor 21.

The internal conductor 21 allows a transmission signal to propagate therealong and may comprise an input terminal and an output terminal formed on ends thereof which are connected to an input transmission line and an output transmission line, respectively. The internal conductor 21 may be shaped like a cylinder. Other shapes may also be used. For example, the internal conductor 21 and/or the external conductor 22 may have a cubic shape or a hexagonal shape.

The external conductor 22 may also be shaped like a cylinder and has the same axis as the internal conductor 21. The external conductor 22 is spaced apart from the internal conductor 21 by a predetermined distance. The external conductor 22 is connected to a ground terminal (not shown) which is provided on an outside of the device to protect against the surge voltage.

The signal electrodes 23a protrude from the internal conductor 21 toward the external conductor 22, but do not actually contact the external conductor 22. As illustrated in FIG. 5B, the signal electrodes 23a are extended along the axial direction of the internal conductor 21. The signal electrodes 23a may be shaped like plates which are spaced apart along a circumferential direction of the internal conductor 21 by a predetermined radial angle. For example, if there are four signal electrodes 23a, the respective signal electrodes 23a may be spaced 90° apart from each other with respect to the axis of the internal conductor 21.

The ground electrodes 24a protrude from the external conductor 22 toward the internal conductor 21 but do not actually contact the internal conductor 21. As illustrated in FIGS. 5A and 5B, the ground electrodes 24a extend along a lengthwise direction of the external conductor 22. The ground electrodes 24a may be spaced along a circumferential direction of the external conductor 22 (i.e., by the predetermined radial angle) and may also be shaped like plates. The ground electrodes 24a may include a plurality of ground electrodes 24a disposed between the signal electrodes 23a.

A number and a position of the signal electrodes 23a and the ground electrodes 24a of the device to protect against the surge voltage according to the present embodiment may be varied, and is not limited to the arrangement illustrated in FIGS. 5A and 5B.

Figure 6A:
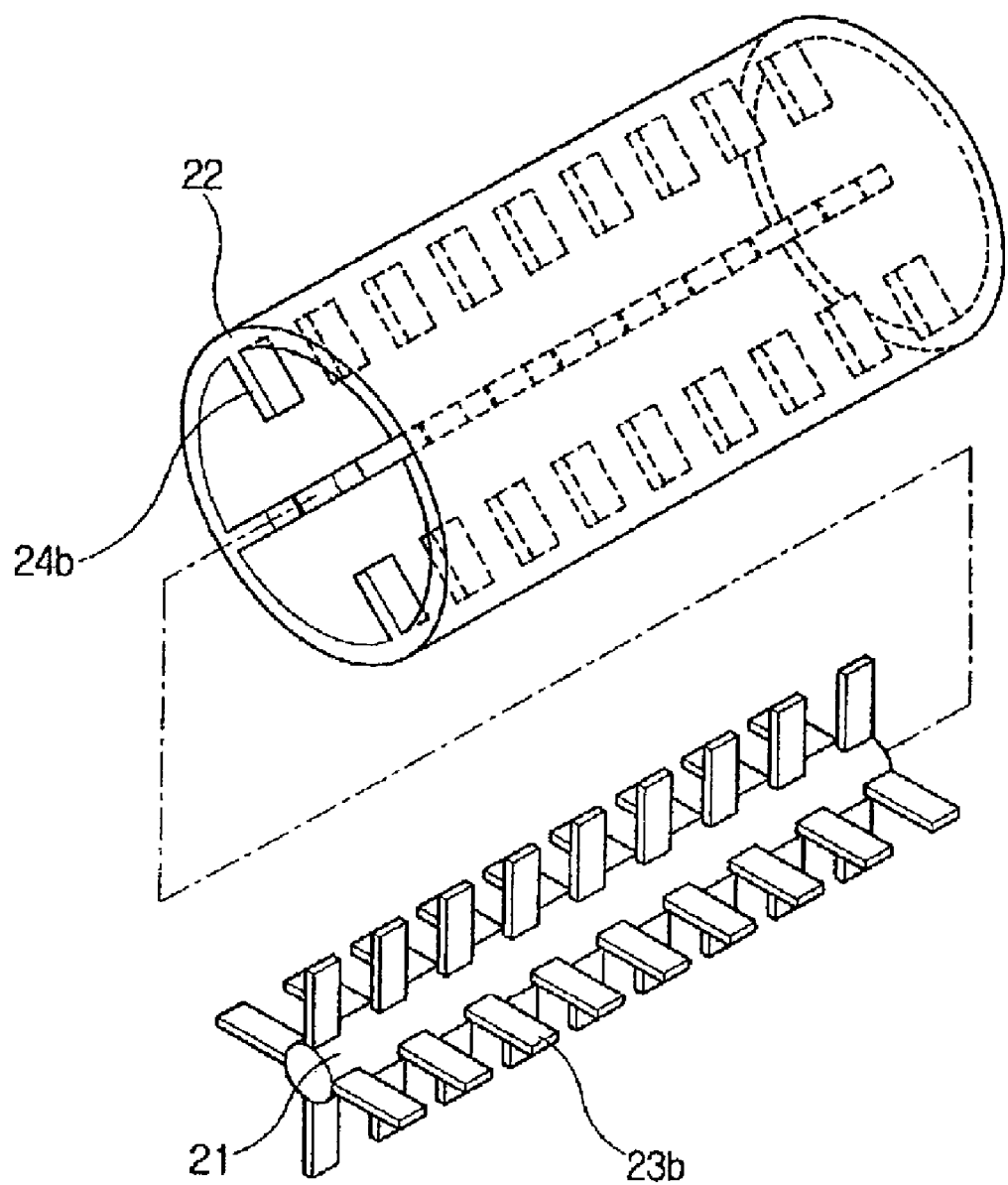
FIG. 6A is another exploded perspective view illustrating the device to protect against the surge voltage of FIG. 5A.
Figure 6B:
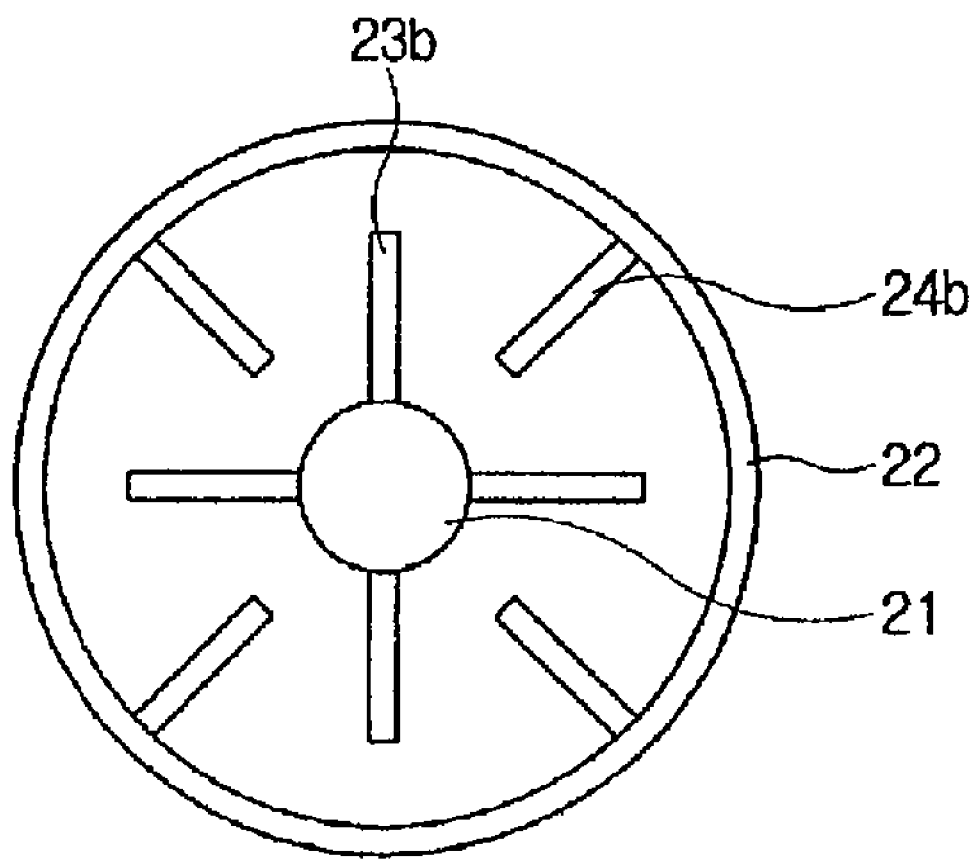
FIG. 6B is a front view illustrating the device to protect against the surge voltage of FIG. 6A.
Figure 6C:
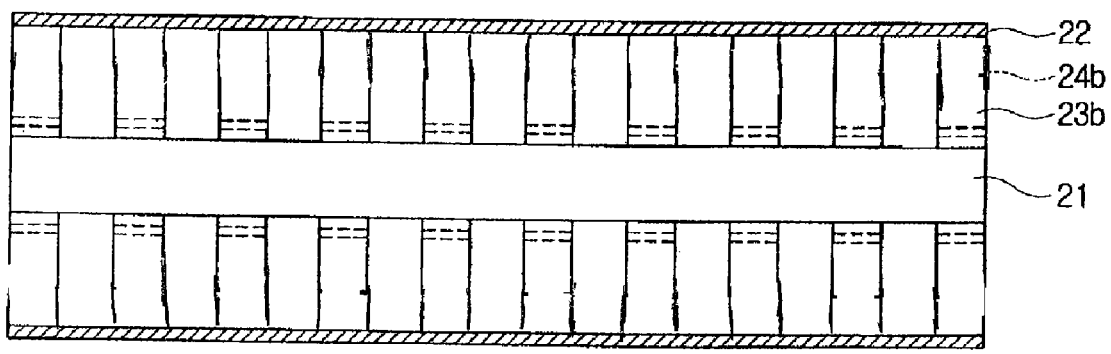
FIG. 6C is a sectional side view illustrating the device to protect against the surge voltage of FIG. 6A.

FIG. 6A is another exploded perspective view illustrating the device to protect against the surge voltage of FIG. 5A, FIG. 6B is a front view illustrating the device to protect against the surge voltage of FIG. 6A, and FIG. 6C is a sectional side view illustrating the device to protect against the surge voltage of FIG. 6A. As illustrated in FIG. 6A, the signal electrodes 23b that protrude from the internal conductor 21 toward the external conductor 22 may be provided as a plurality along an axial direction of the internal conductor 21. The ground electrodes 24b may also be provided as a plurality along the axial direction of the internal conductor 21.

FIGS. 6B and 6C, illustrate positions of the respective signal electrodes 23b and the ground electrodes 24b when viewed from an end of the device to protect against the surge voltage and from a side thereof, respectively.

As illustrated in FIG. 6B, the signal electrodes 23b and the ground electrodes 24b cross each other along the axial direction. As illustrated in FIG. 6C, the signal electrodes 23b and the ground electrodes 24b are superimposed with respect to each other in a radial direction and along the axial direction.

Additionally, as seen in FIGS. 6A to 6C, a wide surface of the signal electrodes 23b and the ground electrodes 24b is parallel to the axial direction of the internal conductor 21 and the external conductor 22. The signal electrodes 23b disposed on a line parallel to the axis of the internal conductor 21 are spaced-apart from each other as shown in FIG. 6A.

Figure 7A:
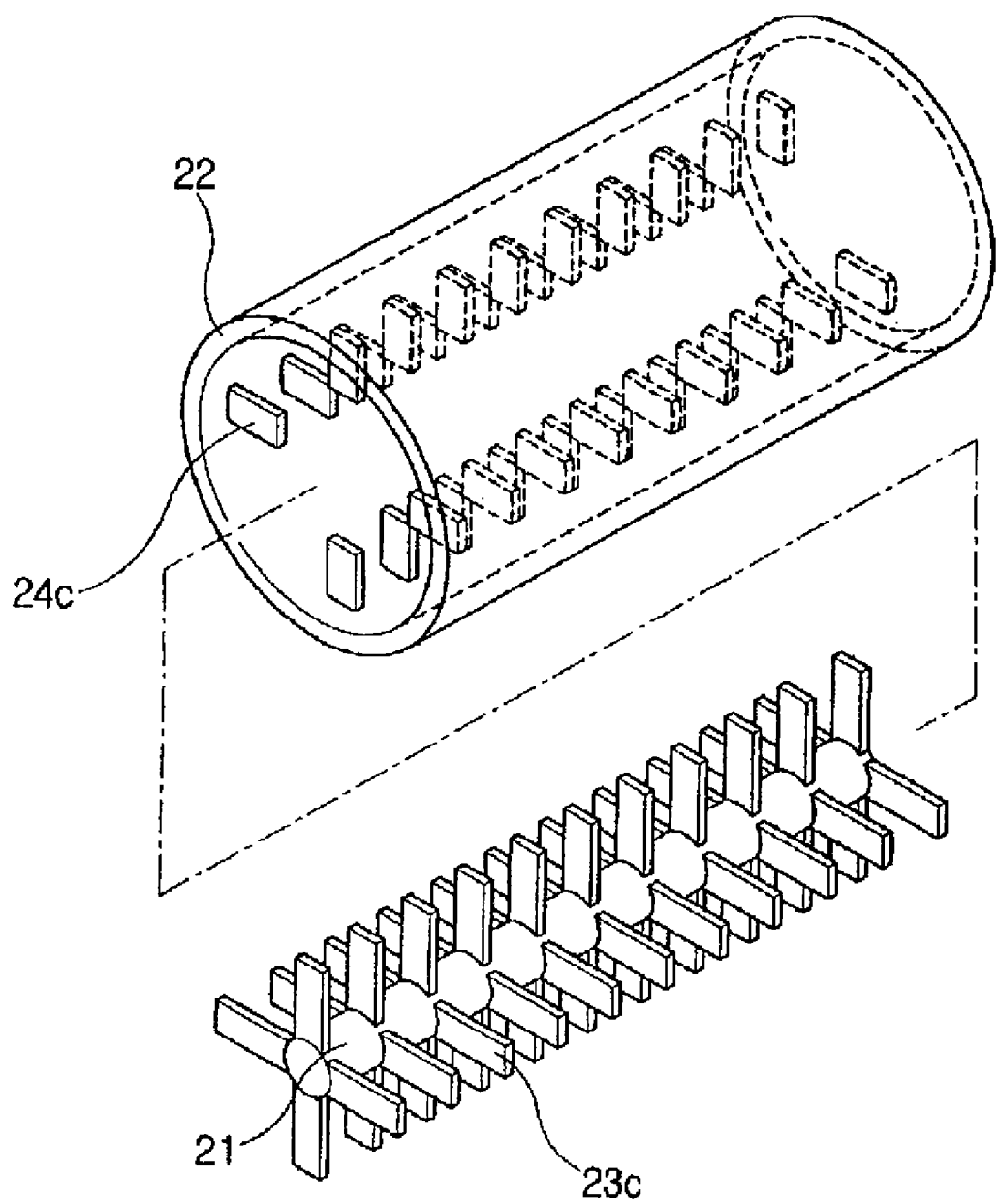
FIG. 7A is another exploded perspective view illustrating the device to protect against the surge voltage of FIG. 5A.
Figure 7B:
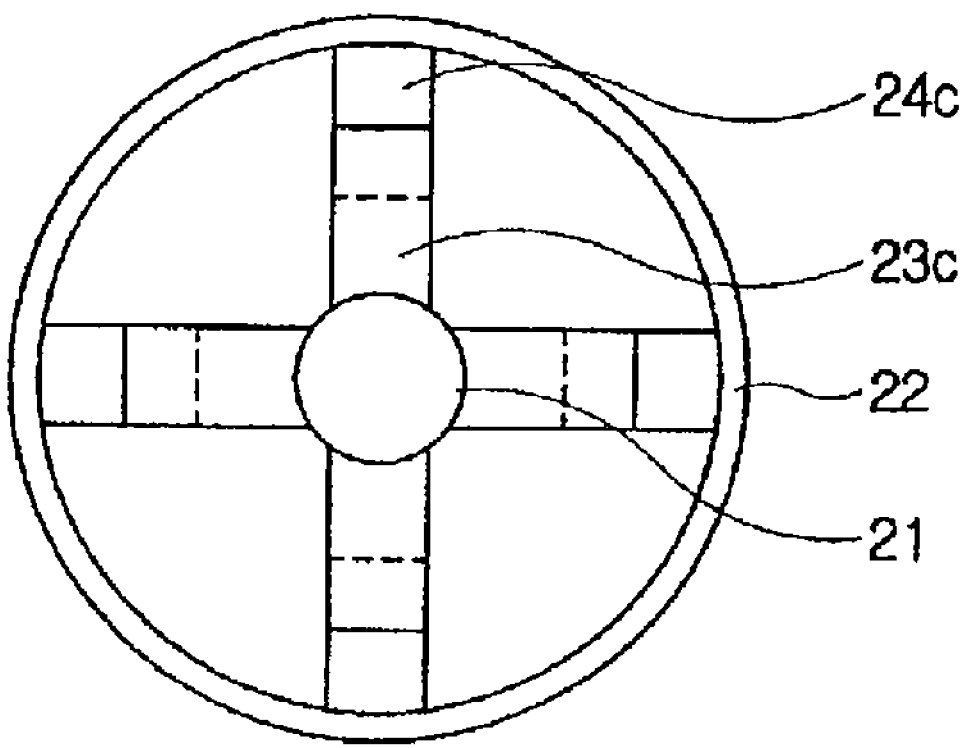
FIG. 7B is a front view illustrating the device to protect against the surge voltage of FIG. 7A.
Figure 7C:
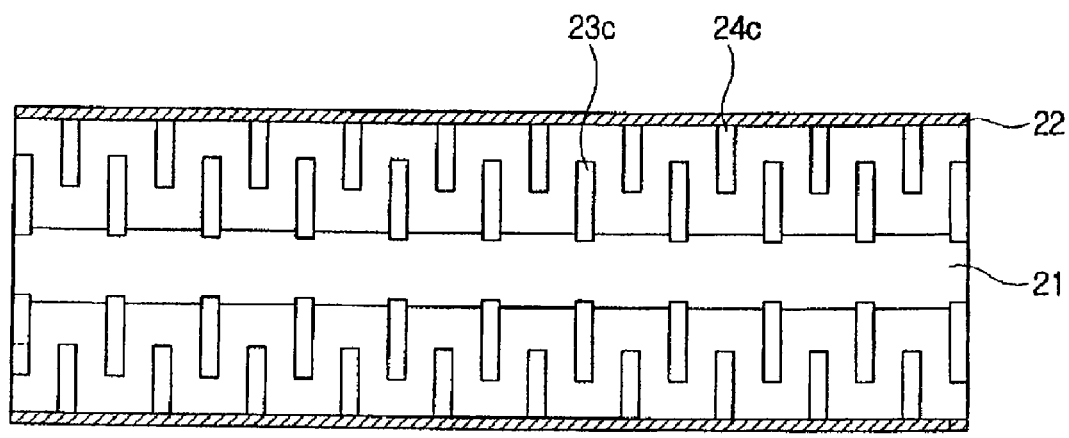
FIG. 7C is a sectional side view illustrating the device to protect against the surge voltage of FIG. 7A.

FIG. 7A is another exploded perspective view illustrating the device to protect against the surge voltage of FIG. 5A, FIG. 7B is a front view illustrating the device to protect from the surge voltage of FIG. 7A, and FIG. 7C is a sectional side view illustrating the device to protect against the surge voltage of FIG. 7A.

As illustrated in FIGS. 7B and 7C, the signal electrodes 23c and the ground electrodes 24c are superimposed with respect to each other at the front view of the axial direction (FIG. 7B). The signal electrodes 23c and the ground electrodes 24c cross each other at the perspective view and the sectional side view (FIGS. 7A and 7C) along a lengthwise direction of the axial direction. Additionally, as seen in FIGS. 7A to 7C, a wide surface of the signal electrodes 23c and the ground electrodes 24c is perpendicular to the axial direction of the internal conductor 21 and the external conductor 22. The signal electrodes 23b disposed around the circumferential direction of the axis of the internal conductor 21 overlap the ground electrodes 24b in a plane formed along and perpendicular to the internal conductor 21.

As illustrated in FIGS. 5A through 7C, varistor characteristics and the characteristic impedance may be controlled by adjusting a position, a size, and an interval of the signal electrodes 23 (i.e., 23a, 23b, and 23c) provided on the internal conductor 21 and the position, the size, and the interval of the ground electrodes 24 (i.e., 24a, 24b, and 24c) provided on the external conductor 22, and by adjusting the metal oxide disposed between the external conductor 22 and the internal conductor 21.

Figure 8A:
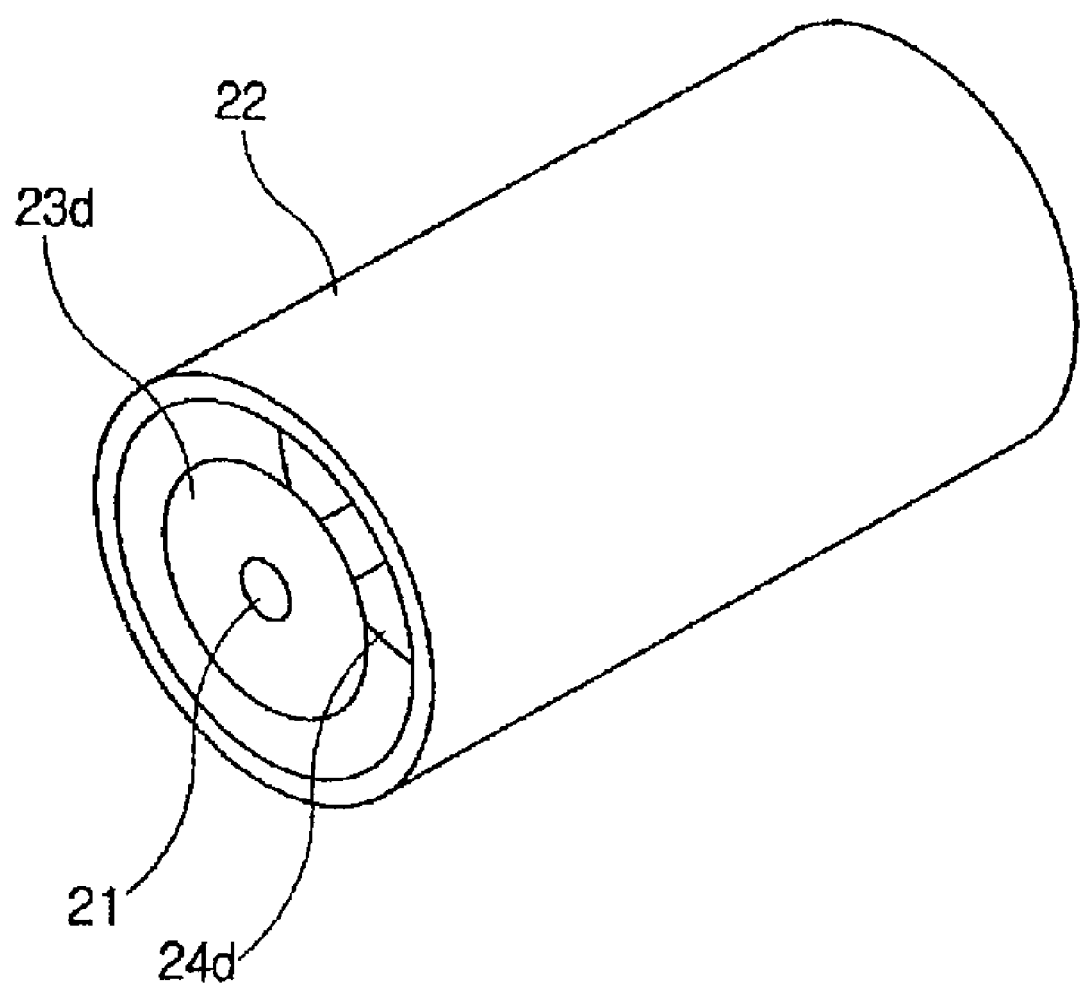
FIG. 8A is a perspective view illustrating a device to protect against a surge voltage according to another embodiment of the present general inventive concept.
Figure 8B:
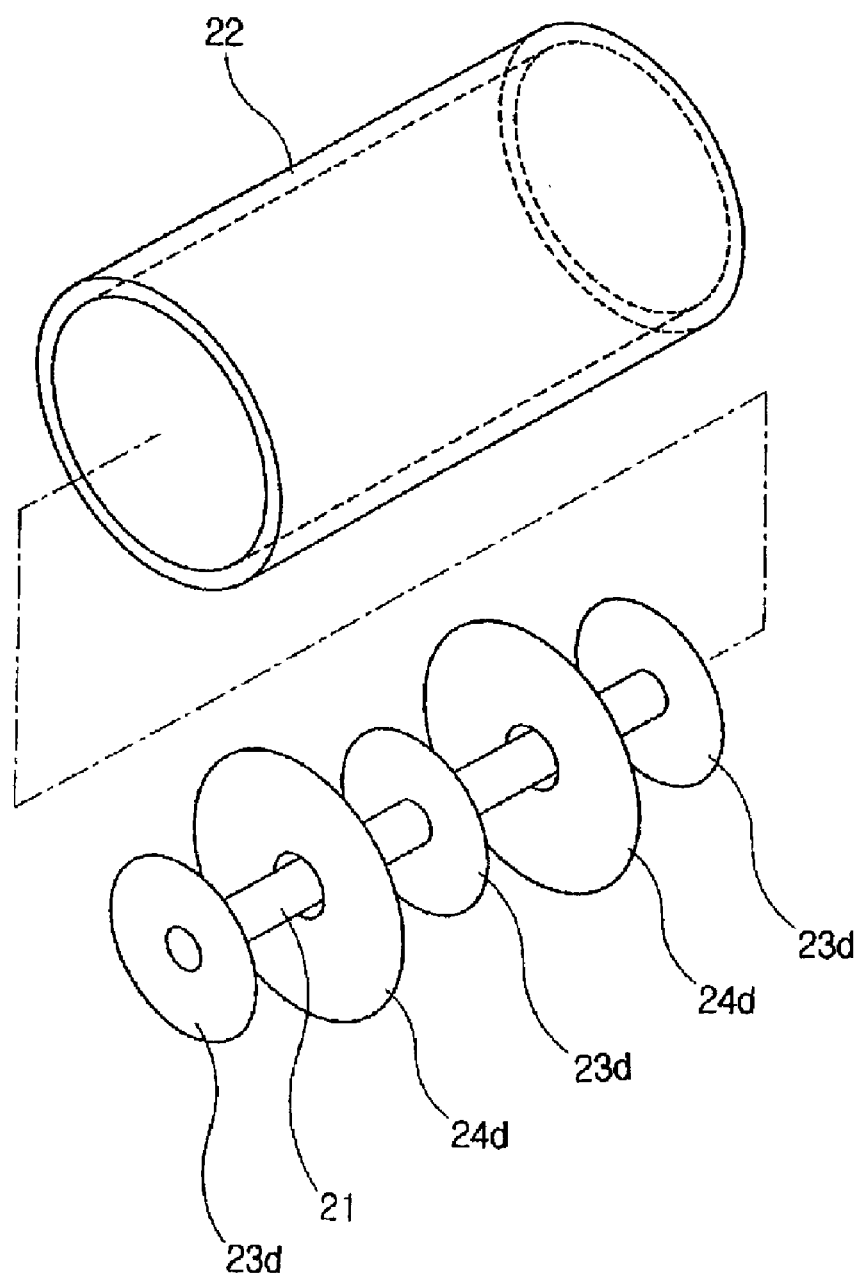
FIG. 8B is an exploded perspective view illustrating the device to protect against the surge voltage of FIG. 8A.

FIG. 8A is a perspective view illustrating a device to protect against a surge voltage according to another embodiment of the present general inventive concept, and FIG. 8B is an exploded perspective view illustrating the device to protect against the surge voltage of FIG. 8A. An internal conductor 21 and an external conductor 22 of the present embodiment may be similar to the internal conductor 21 and the external conductor 22 of the previous embodiments. As illustrated in FIGS. 8A and 8B, the device to protect against the surge voltage comprises the internal conductor 21 which may be shaped like a bar, the external conductor 22 which surrounds the internal conductor 21, and signal electrodes 23d and ground electrodes 24d, which are shaped like round plates and are disposed on the internal conductor 21, to surround the internal conductor 21. The device to protect against the surge voltage according to the present embodiment may comprise metal oxide between the external conductor 22 and the internal conductor 21.

As illustrated in FIGS. 8A and 8B, the signal electrodes 23d are connected to the internal conductor 21. The signal electrodes 23d are provided in a plurality and are shaped like round plates.

As illustrated in FIGS. 8A and 8B, the ground electrodes 24d are connected to the external conductor 22. The ground electrodes 24d are provided in a plurality and are also shaped like round plates. Since the ground electrodes 24d are not connected to the internal conductor 21, the ground electrodes 24d comprise holes at a center portion thereof that are larger than a radius of the internal conductor 21.

The plurality of signal electrodes 23d and the ground electrodes 24d may be alternately provided along a lengthwise direction of the axis.

In the device to protect from the surge voltage according to the present embodiment, desired varistor characteristics and characteristic impedance may be acquired by varying the radius of the internal conductor 21 and/or of the external conductor 22, a radius and a plate thickness of the signal electrodes 23d and of the ground electrodes 24d, and a number of the signal electrodes 23d and the ground electrodes 24d.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A device to protect against a surge voltage, comprising:
    a body having a hexahedron shape and filled with a varistor material;
    a pair of input signal electrodes attached to a first side surface of the body along upward and downward directions;
    a pair of output signal electrodes attached to a second side surface of the body that faces the first side surface of the body in the upward and downward directions;
    a ground electrode attached to an upper surface of the body;
    at least one pair of signal connection electrode plates to connect the input signal electrodes and the output signal electrodes; and
    a ground plate to be connected to the ground electrode.

2. The device to protect against the surge voltage according to claim 1, wherein the ground plate comprises:
    a first ground plate provided in the body to cross a plate surface of the ground electrode in contact therewith; and
    at least one second ground plate provided in the body to cross a plate surface of the first ground plate in contact therewith.

3. The device to protect against the surge voltage according to claim 1, wherein the input signal electrodes and the output signal electrodes extend from the first and second side surfaces along the upper surface and/or a lower surface of the body along a predetermined distance, respectively.

4. The device to protect against the surge voltage according to claim 2, wherein the at least one second ground plate includes a pair of second ground plates spaced apart from each other in the body, and the at least one pair of signal connection electrode plates are disposed on opposite sides of the first ground plate and between the pair of second ground plates on opposite sides within the body.

5. The device to protect against the surge voltage according to claim 4, wherein the pair of second ground plates and the at least one pair of signal connection electrode plates are symmetrical with respect to the first ground plate.

6. The device to protect against the surge voltage according to claim 5, wherein the at least one pair of signal connection electrode plates are spaced apart from the respective second ground plates at a same interval.

7. The device to protect against the surge voltage according to claim 1, wherein the ground plate includes a pair of ground plates respectively disposed on outer side surfaces extending between the first side surface and the second side surface of the body and perpendicular to the first and second side surfaces.

8. The device to protect against the surge voltage according to claim 7, wherein the input signal electrodes and the output signal electrodes extend from the first and second side surfaces along the upper surface and/or a lower surface of the body along a predetermined distance.

9. The device to protect against the surge voltage according to claim 1, wherein:
the body comprises an array of bodies having a composite arrangement;
the pair of input signal electrodes comprises an array of pairs of input signal electrodes attached to the first side surface of respective ones of the array of bodies;
the pair of output signal electrodes comprises an array of pairs of output signal electrodes attached to the second side surface of the respective ones of the array of bodies;
the ground electrode extends across the upper surface of the array of bodies;
the at least one pair of signal connection electrode plates comprises an array of pairs of signal connection electrode plates to connect respective pairs of the input signal electrodes and respective pairs of the output signal electrodes; and
the ground plate comprises a plurality of ground plates disposed between respective ones of the array of bodies to be connected to the ground electrode.

10. A device to protect against a surge voltage, comprising:
a body including a varistor material;
an internal conductor having a bar shape extending within the body;
an external conductor having a cylindrical shape and spacedly provided along an outside of the internal conductor to surround the body;
at least one signal electrode protruding from the internal conductor toward the external conductor without contacting the external conductor; and
at least one ground electrode protruding from the external conductor toward the internal conductor, without contacting the internal conductor,
wherein the varistor material is disposed between the external conductor and the internal conductor.

11. The device to protect against the surge voltage according to claim 10, wherein the at least one signal electrode includes a plurality of signal electrodes having plate shapes that extend along a lengthwise direction of the internal conductor, and being spaced along a circumferential direction of the internal conductor by a predetermined radial angle about an axis of the internal conductor.

12. The device to protect against the surge voltage according to claim 11, wherein the at least one ground electrode includes a plurality of ground electrodes having plate shapes that extend along a lengthwise direction of the external conductor and being spaced around a circumferential direction of the external conductor by a predetermined radial angle.

13. The device to protect against the surge voltage according to claim 12, wherein the plurality of ground electrodes are disposed between the signal electrodes.

14. The device to protect against the surge voltage according to claim 12, wherein each of the plate shapes of the ground electrodes and the signal electrodes includes a plurality of sub-plates arranged along the lengthwise direction of the external and internal conductors, and each sub plate has a wide portion and a thin portion, and the wide portion extends parallel to the lengthwise direction of the external conductor.

15. The device to protect against the surge voltage according to claim 12, wherein each of the plate shapes of the ground electrodes and the signal electrodes includes a plurality of sub-plates arranged along the lengthwise direction of the external and internal conductors, and each sub plate has a wide portion and a thin portion, and the wide portion extends perpendicular to the lengthwise direction of the external conductor.

16. The device to protect against the surge voltage according to claim 10, wherein the at least one signal electrode includes a plurality of signal electrodes having round plate shapes that extend in a radial direction of the internal conductor.

17. The device to protect against the surge voltage according to claim 14, wherein the at least one ground electrode includes a plurality of ground electrodes having round plate shapes which comprise a through hole through which the internal conductor passes.

18. The device to protect against the surge voltage according to claim 17, wherein the plurality of ground electrodes are disposed between the signal electrodes.

19. The device to protect against the surge voltage according to claim 18, wherein opposite end terminals of the internal conductor comprise an input terminal and an output terminal that are connectable with an unbalanced transmission line.

20. A surge protection device, comprising:
a body including a varistor material;
at least one input terminal disposed at a first side of the body;
at least one output terminal disposed at a second side of the body;
at least one signal electrode to connect the at least one input terminal with the at least one output terminal and passing through the body; and
at least one ground electrode disposed outside the body and extending into the body about the at least one signal electrode.

21. The surge protection device according to claim 20, wherein:
the body comprises a hexahedron;
the at least one input terminal comprises a pair of input electrodes disposed on the first side of the body;
the at least one output terminal comprises a pair of output electrodes disposed on the second side of the body;
the at least one signal electrode comprises a pair of signal electrodes respectively disposed between the pairs of input and output electrodes; and
the at least one ground electrode comprises an external ground electrode disposed on a third side of the body and at least one ground plate extending through the body about the pair of signal electrodes and in contact with the external ground electrode.

22. The surge protection device according to claim 21, wherein the at least one ground plate comprises:
a first ground plate disposed along a first direction within the body in between the pair of input electrodes and in between the pair of output electrodes; and
a pair of second ground plates disposed on each side of the pair of signal electrodes and extending through the first ground plate.

23. The surge protection device according to claim 22, wherein the pair of second ground plates are disposed along a second direction perpendicular to the first direction.

24. The surge protection device according to claim 21, wherein:
the body comprises an elongated rectangular array;
the pair of input electrodes comprises a plurality of pairs of input electrodes;
the pair of output electrodes comprises a plurality of pairs of output electrodes;
the pair of signal electrodes comprises a plurality of pairs of signal electrodes; and
the at least one ground plate comprises a plurality of ground plates disposed between each of the pairs of signal electrodes extending from the first side of the body to the second side of the body, and each of the plurality of ground plates contacting the external ground electrode.

25. The surge protection device according to claim 21, wherein the at least one input electrode and the at least one output electrode extend from the first side and the second side of the body around respective edges thereof onto respective portions of the third side of the body.

26. The surge protection device according to claim 20, wherein the varistor material comprises a metal oxide including one or more of ZnO, $SB_2O_3$, $Co_3O_4$, $MnCO_3$, NiO, and $Cr_2O_3$.

27. The surge protection device according to claim 20, wherein:
the ground electrode comprises an elongated outer conductor to surround the body and including one or more ground plates extending from an inner surface thereof into the body; and
the signal electrode comprises an elongated inner conductor disposed within the outer conductor along an axis thereof and having one or more signal plates extending from an outer surface thereof toward the outer conductor without contacting the outer conductor.

28. The surge protection device according to claim 27, wherein the at least one input terminal comprises a first end of the inner conductor, and the at least one output terminal comprises a second end of the inner conductor.

29. The surge protection device according to claim 27, wherein the outer conductor and the inner conductor are cylindrically shaped.

30. The surge projection device according to claim 27, wherein:
the outer and inner conductors are coaxial with respect to a predetermined elongated axis;
the one or more ground plates comprise a plurality of ground plates extending from the inner surface of the outer conductor toward the inner conductor without contacting the inner conductor and along the predetermined elongated axis; and
the one or more signal plates comprise a plurality of signal plates extending from the outer surface of the inner conductor toward the outer conductor without contacting the outer conductor and along the predetermined elongated axis.

31. The surge protection device according to claim 30, wherein each of the ground plates and each of the signal plates extends a length of the inner and outer conductors.

32. The surge protection device according to claim 30, wherein each of the ground plates and each of the signal plates has a plurality of protruding portions extending along a length of the inner and outer conductors, and each of the protruding portions includes a wide portion extending parallel to the predetermined elongated axis, and a thin portion perpendicular to the predetermined elongated axis.

33. The surge protection device according to claim 30, wherein each of the ground plates and each of the signal plates has a plurality of protruding portions extending along a length of the inner and outer conductors, and each of the protruding portions includes a wide portion perpendicular to the predetermined elongated axis, and a thin portion extending parallel to the predetermined elongated axis.

34. The surge protection device according to claim 30, wherein the plurality of ground plates and the plurality of signal plates extend among each other in an alternating manner.

35. The surge protection device according to claim 30, wherein the plurality of ground plates and the plurality of signal plates comprise round plates arranged perpendicular to the predetermined elongated axis and in an alternating arrangement.

36. The surge protection device according to claim 20, wherein the ground electrode comprises a plurality of ground plates extending through the body around the at least one signal electrode.

37. The surge protection device according to claim 20, further comprising:
a printed circuit board having a plurality of contacts to contact the at least one input terminal, the at least one output terminal, and the ground electrode.

38. The surge protection device according to claim 20, further comprising:
a transmission line having a first portion to contact the at least one input terminal and a second portion to contact the at least one output terminal.

39. A varistor, comprising:
an outer conductor;
an inner conductor disposed within the outer conductor to propagate a signal;
a plurality of outer conductor plates extending from an inner surface of the outer conductor; and
a plurality of inner conductor plates extending from an outer surface of the inner conductor in between the plurality of outer conductor plates.

40. The varistor according to claim 39, further comprising:
a varistor material to fill a space between the inner and outer conductors,
wherein the outer conductor is grounded.

41. The varistor according to claim 39, further comprising:
a transmission line having the varistor disposed in a portion thereof.

42. An electronic apparatus, comprising:
a printed circuit board having a board input terminal and a board output terminal thereon; and
a surge protection device, comprising
a body including a varistor material,
at least one input terminal disposed at a first side of the body in contact with the board input terminal,
at least one output terminal disposed at a second side of the body in contact with the board output terminal,
at least one signal electrode to connect the at least one input terminal with the at least one output terminal and passing through the body, and
at least one ground electrode disposed outside the body and extending into the body about the at least one signal electrode.

43. A device to protect against a surge voltage, comprising:
a body having an input electrode and an output electrode disposed on opposite outer sides of the body;
a ground electrode disposed on an outer side of the body perpendicular to the opposite sides;
a signal connection electrode plate provided within the body to electrically connect the input electrode and the output electrode; and
first and second ground plates provided within the body and connected to the ground electrode such that the first ground plate crosses a plate surface of the ground electrode in contact therewith and the second ground plate crosses a plate surface of the first ground plate in contact therewith.

* * * * *